US009881923B1

(12) United States Patent
Juengling (10) Patent No.: US 9,881,923 B1
(45) Date of Patent: *Jan. 30, 2018

(54) FLOATING BODY TRANSISTORS AND MEMORY ARRAYS COMPRISING FLOATING BODY TRANSISTORS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/681,734

(22) Filed: Aug. 21, 2017

Related U.S. Application Data

(63) Continuation of application No. 15/391,656, filed on Dec. 27, 2016, now Pat. No. 9,773,788.

(51) Int. Cl.
*H01L 27/108* (2006.01)
*H01L 29/78* (2006.01)

(52) U.S. Cl.
CPC .... *H01L 27/10802* (2013.01); *H01L 29/7841* (2013.01); *H01L 27/10826* (2013.01)

(58) Field of Classification Search
CPC ......... H01L 27/10802; H01L 27/10826; H01L 29/7841
See application file for complete search history.

(56) References Cited

U.S. PATENT DOCUMENTS

| 8,741,758 B2 | 6/2014 | Juengling |
| 2009/0237996 A1 | 9/2009 | Kirsch et al. |
| 2011/0193157 A1 | 8/2011 | Juengling |
| 2014/0185355 A1 | 7/2014 | Juengling |

*Primary Examiner* — Nicholas Tobergte
(74) *Attorney, Agent, or Firm* — Wells St. John P.S.

(57) ABSTRACT

Some embodiments include a floating body transistor which has a gate structure configured as a bracket having two upwardly-projecting sidewalls joined to a base. A region between the upwardly-projecting sidewalls is an interior region of the bracket. The interior region of the bracket has an interior surface along an upper surface of the base, and along inward surfaces of the upwardly-projecting sidewalls. The sidewalls are a first sidewall and a second sidewall. The first and second sidewalls have first and second notches, respectively, which extend downwardly into the first and second sidewalls. The first and second notches are horizontally aligned with one another. Dielectric material lines the interior surface of the bracket. A semiconductor material body is within the interior region of the bracket and along the dielectric material. The semiconductor material body has a third notch which is horizontally aligned with the first and second notches.

17 Claims, 11 Drawing Sheets

FLOATING BODY TRANSISTORS AND MEMORY ARRAYS COMPRISING FLOATING BODY TRANSISTORS

RELATED PATENT DATA

This patent resulted from a continuation of U.S. patent application Ser. No. 15/391,656, which was filed Dec. 27, 2016, which issued as U.S. Pat. No. 9,773,788, and which is hereby incorporated herein by reference.

TECHNICAL FIELD

Floating body transistors and memory arrays comprising floating body transistors.

BACKGROUND

Memory is one type of integrated circuitry, and is used in computer systems for storing data. Integrated memory is usually fabricated in one or more arrays of individual memory cells. The memory cells may be volatile, semi-volatile, or nonvolatile.

The memory cells are configured to retain or store information in at least two different selectable states. In a binary system, the states are considered as either a "0" or a "1".

A continuing goal of memory design is to increase packing density (i.e., to increase the level of integration), while maintaining performance within accepted tolerances. Another continuing goal is to improve stability of memory devices across an array. Yet another continuing goal is to reduce fabrication costs. It is desired to develop improved memory array architectures which may achieve one or more of the continuing goals associated with memory design.

BRIEF DESCRIPTION OF THE DRAWINGS

FIGS. 1A, 1B, 1C, 1D and 1E are views of an example floating body transistor from the memory array of FIG. 1.

DETAILED DESCRIPTION OF THE ILLUSTRATED EMBODIMENTS

Some embodiments include new floating body transistor structures suitable for incorporation into highly integrated circuitry, such as, for example, memory. Some embodiments include new memory array designs which incorporate the floating body transistor structures. Example embodiments are described with reference to FIGS. 1-9.

Figure 1:
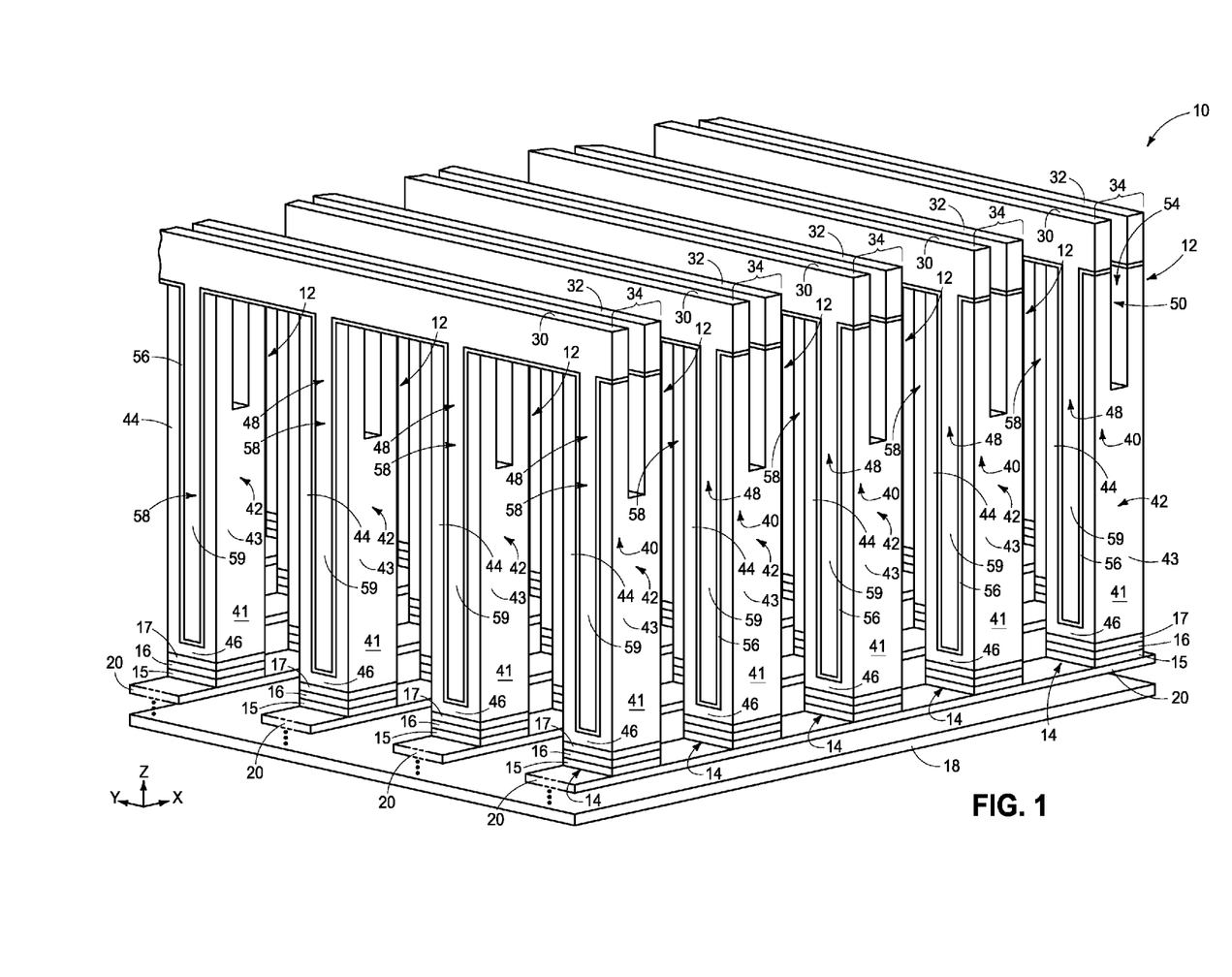
FIG. 1 is a diagrammatic three-dimensional view of a region of an example memory array.

Referring to FIG. 1, a memory array 10 comprises a plurality of floating body transistors 12 over a plurality of spaced-apart capacitors 14. The floating body transistors 12 are in one-to-one correspondence with the capacitors.

Each of the capacitors 14 is a stack comprising a lower electrode 15, an insulative (i.e., dielectric) material 16, and an upper electrode 17. The lower electrodes 15 are electrically coupled with wordlines 20, and are supported by a substrate 18.

The substrate 18 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the substrate 18 may correspond to a semiconductor substrate containing one or more materials associated with integrated circuit fabrication. Such materials may include, for example, one or more of refractory metal materials, barrier materials, diffusion materials, insulator materials, etc. The substrate 18 is illustrated to be spaced from wordlines 20 to indicate that there may be circuitry, materials, levels, etc. (not shown) between the substrate 18 and the wordlines 20 in some embodiments.

The electrodes 15 and 17 may comprise any suitable electrode materials; and in some embodiments may comprise, consist essentially of, or consist of one or more materials selected from the group consisting of W, WN, TiN, TiCN, TiAlN, TiAlCN, Ti—W, Ru—TiN, TiOCN, RuO, RuTiON, TaN, TaAlN, TaON and TaOCN, etc., where the formulas indicate primary constituents rather than specific stoichiometries. The electrode materials may include elemental metals, alloys of two or more elemental metals, conductive metal compounds, and/or any other suitable materials. Although the electrodes 15 and 17 are illustrated to comprise single homogeneous materials, in other embodiments the electrodes 15 and 17 may comprise two or more discrete separate materials. The electrodes 15 and 17 may comprise the same composition, or may comprise different compositions relative to one another.

The capacitors 14 may be ferroelectric capacitors or non-ferroelectric capacitors. If the capacitors 14 are non-ferroelectric capacitors, the insulative material 16 may consist of non-ferroelectric materials; such as silicon dioxide, silicon nitride, etc. If the capacitors are ferroelectric capacitors, the insulative material 16 may comprise insulative ferroelectric material; and in some embodiments may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element. Although the insulative material 16 is illustrated to comprise a single homogeneous material, in other embodiments the insulative material 16 may comprise two or more discrete separate materials.

The wordlines 20 may comprise any suitable composition or combination of compositions; and in some embodiments may comprise, consist essentially of, or consist of one or more metals (for instance, copper), metal-containing compositions (for instance, metal nitrides, metal silicides, alloys of two or more metals, etc.) and/or conductively-doped semiconductor materials (for instance, conductively-doped silicon, conductively-doped germanium, etc.).

The wordlines 20 may be considered to extend along rows of the memory array 10.

Conductive lines 30 and 32 extend across the floating body transistors 12. The conductive lines 30/32 are in pairs 34; with conductive lines 30 being first lines within the pairs 34, and conductive lines 32 being second lines within the pairs 34. The lines 30/32 may be considered to extend along columns of the memory array 10.

In some embodiments the first lines 30 are held at a different voltage than the second lines 32. For instance, the first lines 30 may be at a power supply voltage, Vcc; and the second lines 32 may be at a ground voltage, Vss.

The floating body transistors 12 comprise gate structures 40 configured as brackets 42 having two upwardly-projecting sidewalls 43 and 44 over a base 46. The sidewalls 43/44 may be referred to as a first sidewall 43 and a second sidewall 44.

FIGS. 1A-1E provide a plurality of views of one of the floating body transistors 12 to further assist in explaining the various features of the floating body transistors. An axis system X, Y, Z is provided adjacent the views of FIG. 1 and FIGS. 1A-E to assist in understanding the relative orientations of the views.

Figure 1A:
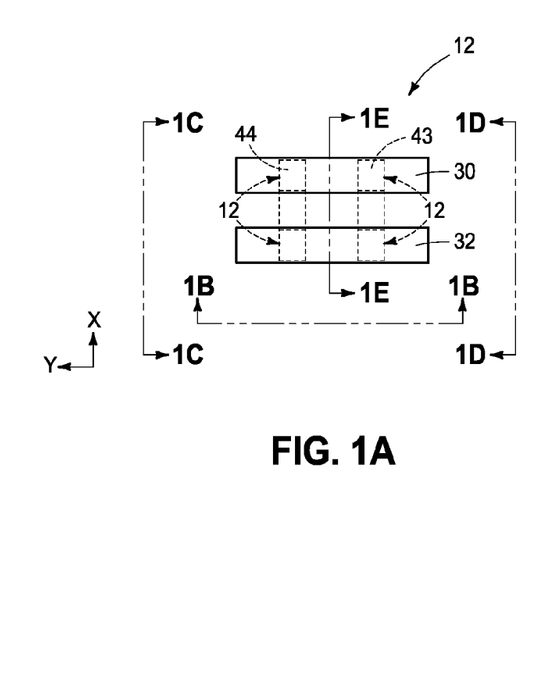
FIG. 1A is a top view over the example floating body transistor.
Figure 1B:
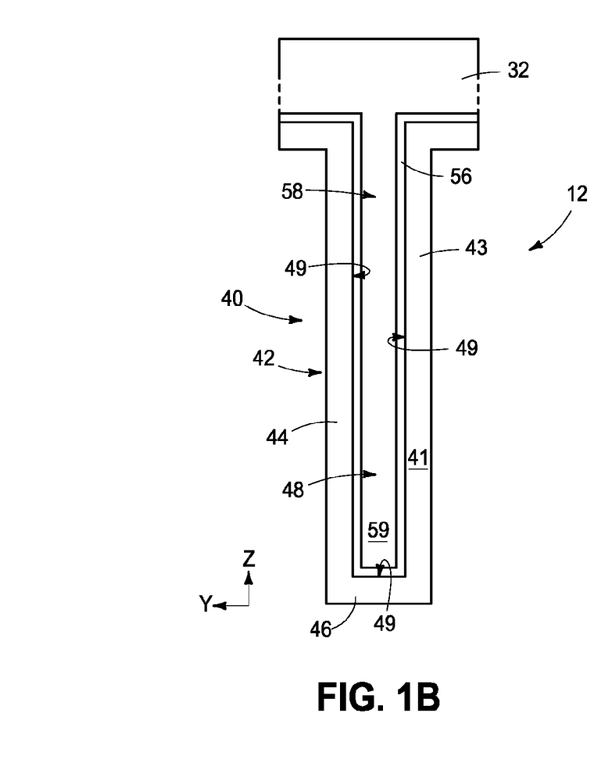
FIGS. 1B, 1C and 1D are side views along the lines 1B-1B, 1C-1C and 1D-1D, respectively of FIG. 1A.
Figure 1C:
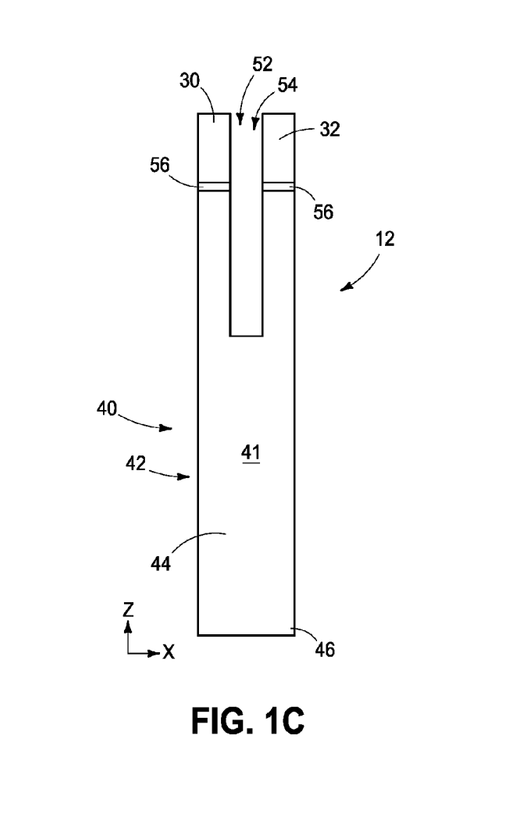
Figure 1D:
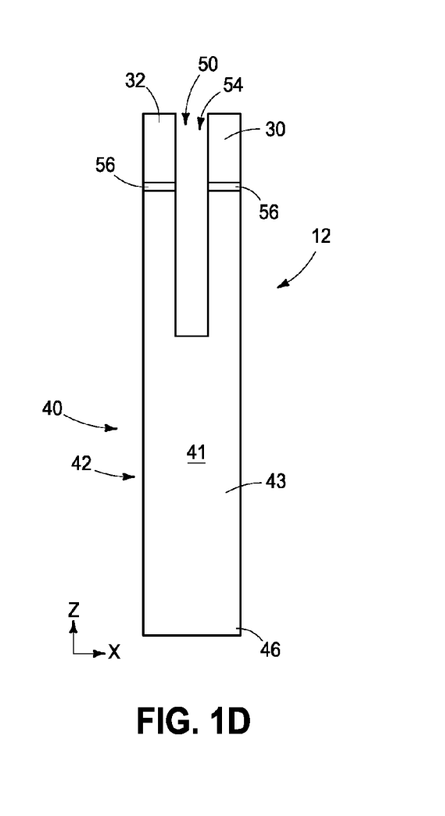

FIG. 1A provides a top view, and shows the conductive lines 30/32. Regions of the floating body transistor 12 are shown in dashed-line view in FIG. 1A to indicate that such regions are out of the plane of the FIG. 1A view (and specifically are below such plane).

The gate structures 40 comprise gate structure material 41. Such gate structure material 41 may be any suitable composition or combination of compositions; and in some embodiments may comprise, consist essentially of, or consist of one or more metals (for instance, copper), metal-containing compositions (for instance, metal nitrides, metal silicides, alloys of two or more metals, etc.) and/or conductively-doped semiconductor materials (for instance, conductively-doped silicon, conductively-doped germanium, etc.). In some embodiments the gate structure material 41 may comprise metal and/or metal-containing compositions; such as, for example, titanium and/or titanium nitride. In some embodiments the gate structure material 41 may comprise conductively-doped silicon; such as, for example, n-type doped silicon. In some embodiments the upper electrodes 17 of the capacitors 14 comprise metal, and the gate structures 40 comprise conductively-doped silicon directly against such metal of the upper electrodes 17. In some embodiments the upper electrodes 17 of the capacitors 14 comprise a first metal, and the gate structures 40 comprise a second metal, different from the first metal, and directly against the first metal of the upper electrodes 17.

A region 48 between the upwardly-projecting sidewalls 43/44 is an interior region of the bracket 42; with such interior region 48 being over the base 46.

The interior region 48 has an interior surface 49 which extends along an upper surface of the base 46, and along inward surfaces of the upwardly-projecting sidewalls 43/44.

The first sidewall 43 has a first notch 50 extending downwardly therein, and the second sidewall 44 has a second notch 52 extending downwardly therein. The first and second notches 50/52 are horizontally aligned with one another so that openings 54 extend entirely through the gate structures 40.

Dielectric material 56 lines the interior surface 49 of the brackets 42. The dielectric material 56 may comprise any suitable composition or combination of compositions, including, for example, silicon dioxide, silicon nitride, etc.

Semiconductor material bodies 58 are within the interior regions 48 of the brackets 42. The semiconductor material bodies 58 are spaced from the brackets 42 by the dielectric material 56.

The semiconductor material bodies 58 have third notches 60 extending downwardly therein, with the third notches 60 being horizontally aligned with the first and second notches 50/52 of the first and second upwardly-projecting sidewalls 43/44 of the brackets 42.

The semiconductor material bodies 58 comprise semiconductor material 59. The material 59 may be any suitable semiconductor material or combination of semiconductor materials (e.g., silicon, germanium, etc.); and in some embodiments may comprise polycrystalline silicon.

Figure 1E:
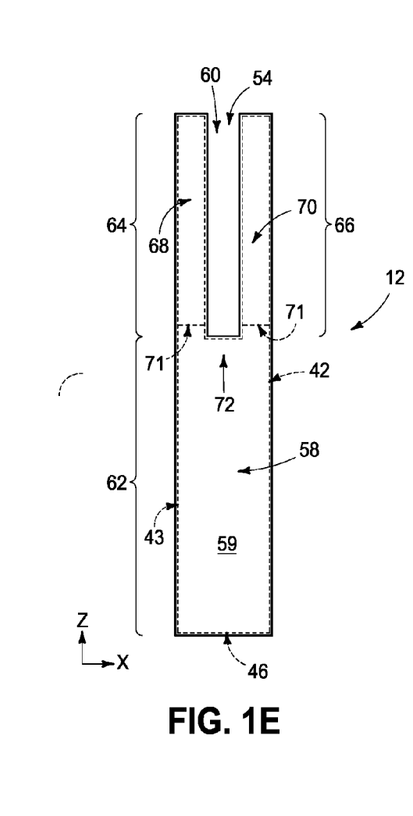
FIG. 1E is a diagrammatic cross-sectional view along the line 1E-1E of FIG. 1A.

One of the semiconductor material bodies 58 is shown in FIG. 1E in cross-sectional side view. A region of the bracket 42 is diagrammatically illustrated in FIG. 1E (and is shown in dashed-line view to indicate that such region of bracket 42 is out of the plane relative to the view of FIG. 1E; and specifically is in front of the plane of such view). The semiconductor material body 58 comprises a lower trunk region 62 which extends from the base 46 of bracket 42 to a bottom of the third notch 60 within the semiconductor material body 58. The semiconductor material body 58 bifurcates into two branches 64 and 66 projecting upwardly from the lower trunk region 62, and extending along the third notch 60. The branch 64 may be referred to as a first branch, and the branch 66 may be referred to as a second branch. Heavily doped source/drain regions 68 and 70 are provided within the first and second branches 64 and 66, respectively; and a channel region 72 extends between the heavily-doped source/drain regions 68/70 and under the third notch 60. Approximate lower boundaries of the heavily-doped source/drain region 68/70 are diagrammatically illustrated in FIG. 1E with dashed lines 71.

Current flow along the channel regions 72 of the floating body transistors 12 is selectively activated by selectively energizing gate structures 40. In operation the dielectric material 56 along the interior regions 48 of brackets 42 functions as gate dielectric between the gate structures 40 and the semiconductor material bodies 58.

The first source/drain regions 68 may be electrically coupled to the first conductive lines 30 of the memory array 10 of FIG. 1, and the second source/drain regions 70 may be electrically coupled to the second conductive lines 32 of the memory array 10 of FIG. 1. In operation the activation of a gate structure 40 of a floating body transistor 12 may cause current flow across channel region 72 and between the source/drain regions 68 and 70, to thereby couple a first conductive line 30 with a second conductive line 32. Such coupling may be utilized to program a memory device comprising a capacitor 14 (e.g., a ferroelectric capacitor 14) under the base 46 of a gate structure 40, and/or to read a memory bit stored by a memory device comprising the capacitor 14 (e.g., a ferroelectric capacitor 14).

Figure 2:
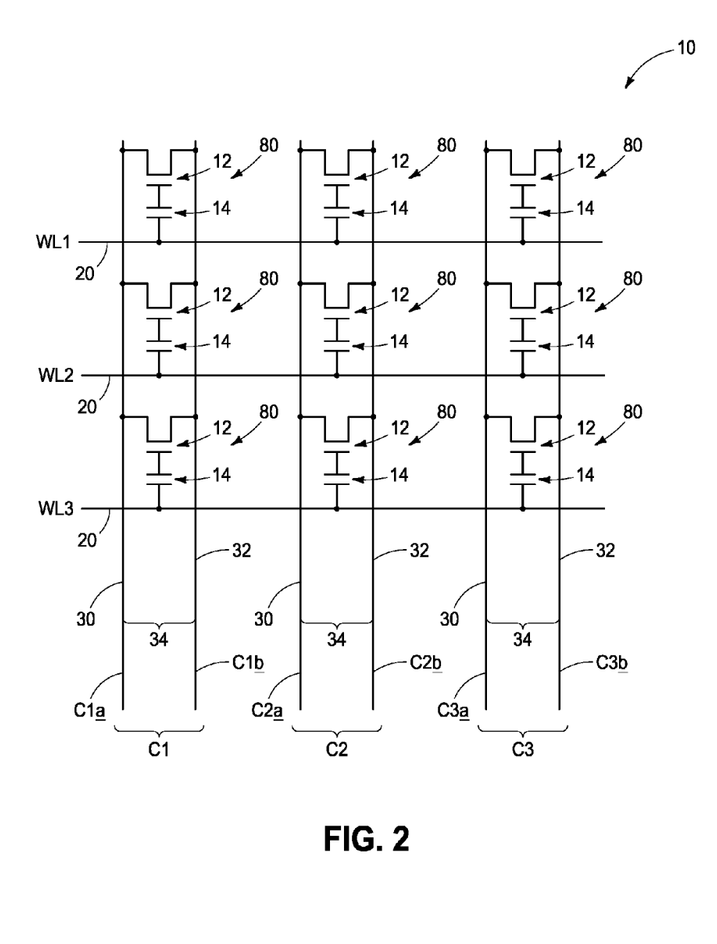
FIG. 2 is a schematic diagram of a region of the memory array of FIG. 1.

FIG. 2 schematically illustrates a region of the memory array 10. The memory array 10 includes a plurality of memory cells 80, with each memory cell including a capacitor 14 and a floating body transistor 12. The wordlines 20 are shown corresponding to wordlines WL1, WL2 and WL3. The conductive lines 30/32 are indicated to be arranged in comparative line pairs (i.e., sets) "C1", "C2" and "C3"; with line 30 being a first comparative line "Ca" within the comparative line pairs, and line 32 being a second comparative line "Cb" within the comparative line pairs. The set C1 comprises comparative lines C1a and C1b, the set C2 comprises comparative lines C2a and C2b, and the set C3 comprises comparative lines C3a and C3b. In operation the sets C1, C2 and C3 may be electrically coupled with circuitry peripheral to the memory array (for instance, sense amplifier circuitry, not shown) to enable values of the comparative bitlines within the sets to be compared (e.g., the values of C1a to C1b may be compared). Utilization of the wordlines WL3/WL2/WL3 with the sets C1/C2/C3 enables each of the memory cells 80 to be uniquely addressed.

An advantage of the illustrated configuration of floating body transistors 12 is that resistance across the transistors may be tailored by adjusting the size of the transistors (and particularly the size of the semiconductor material body 58 of the transistors), which may enable matching of drive current across the floating body transistors 12 relative to the optimal requirements of the capacitors 14. Such may enable resistance of the transistors to be matched for particular applications. For instance, it may be difficult to utilize ferroelectric capacitors in conventional memory applications in that it can be difficult to find a transistor that matches resistance with the ferroelectric capacitor. However, resistance across floating body transistors 12 may be readily matched to a ferroelectric capacitor (or other devices) by simply adjusting the dimensions of the floating body transistors.

The floating body transistors 12 of FIG. 1 may be utilized in other applications besides those described above with reference to FIGS. 1 and 2. For instance, the floating body transistors may be incorporated into dynamic random access memory (DRAM) as described with reference to FIGS. 3 and 4.

Figure 3:
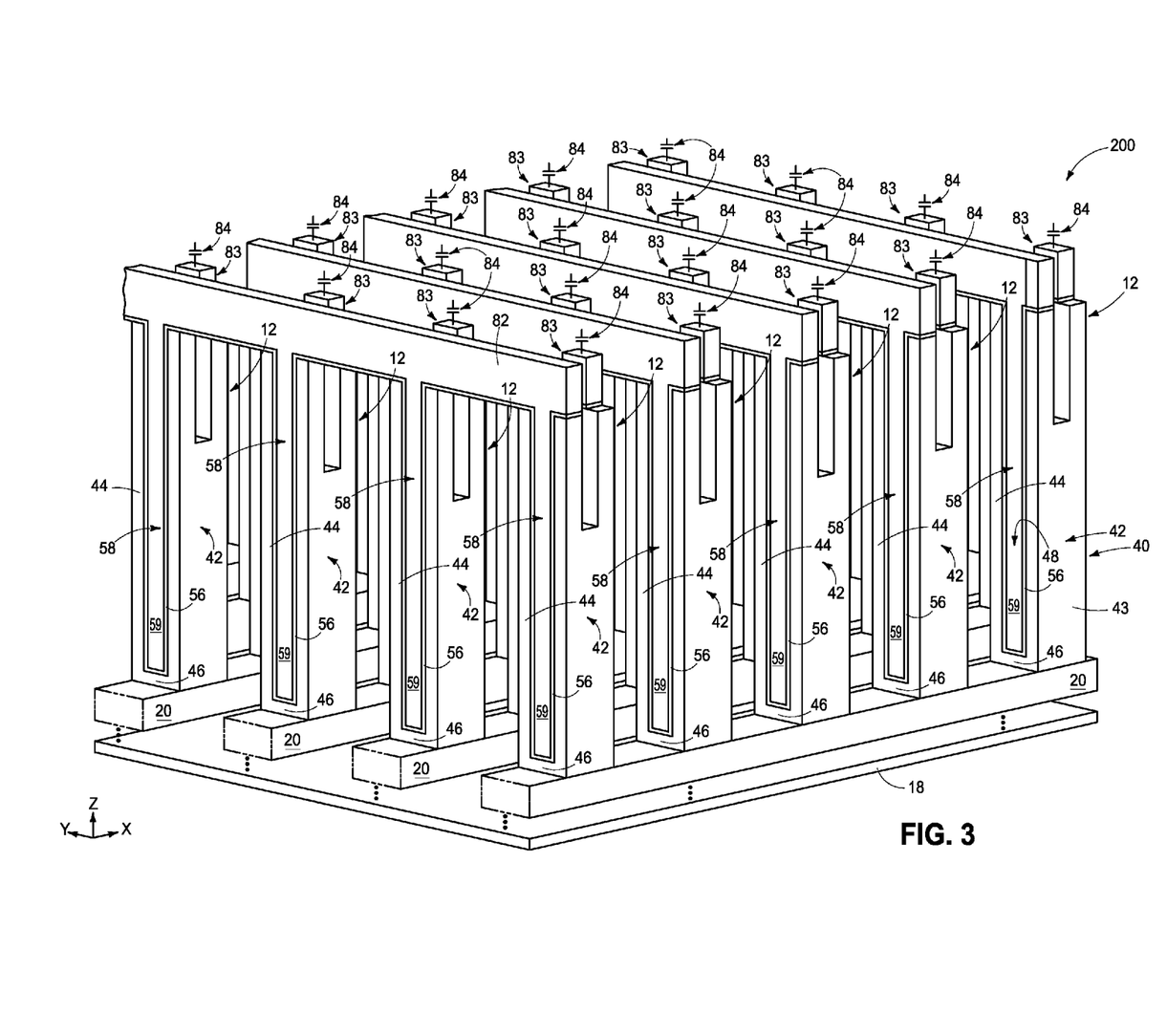
FIG. 3 is a diagrammatic three-dimensional view of a region of an example memory array.

Referring to FIG. 3, a memory array 200 is shown comprising floating body transistors 12 of the type described above with reference to FIG. 1. The bases 46 of the brackets 42 are directly against upper surfaces of wordlines 20. The conductive lines 30 of the memory array 10 of FIG. 1 are replaced with digit lines 82, and the conductive lines 32 are replaced with electrical interconnects 83 extending to capacitors 84 (the capacitors 84 are examples of charge-storage devices; with "charge-storage devices" being devices suitable for reversibly storing charge). The digit lines may comprise any suitable conductive materials, including, for example, any of the materials described above with reference to FIG. 1 as being suitable for the conductive lines 30/32. The capacitors 84 may comprise any suitable capacitor configurations; including, for example, non-ferroelectric configurations or ferroelectric configurations.

All of the structures and components of the memory 200 of FIG. 3 may be identical to those described above with reference to FIGS. 1 and 1A-E, except for the specific differences noted. Accordingly, the digit lines 82 may be electrically-coupled with the first source/drain regions 68 described above with reference to FIG. 1E, and the capacitors 84 may be electrically-coupled with the second source/drain regions 70 described above with reference to FIG. 1E.

Figure 4:
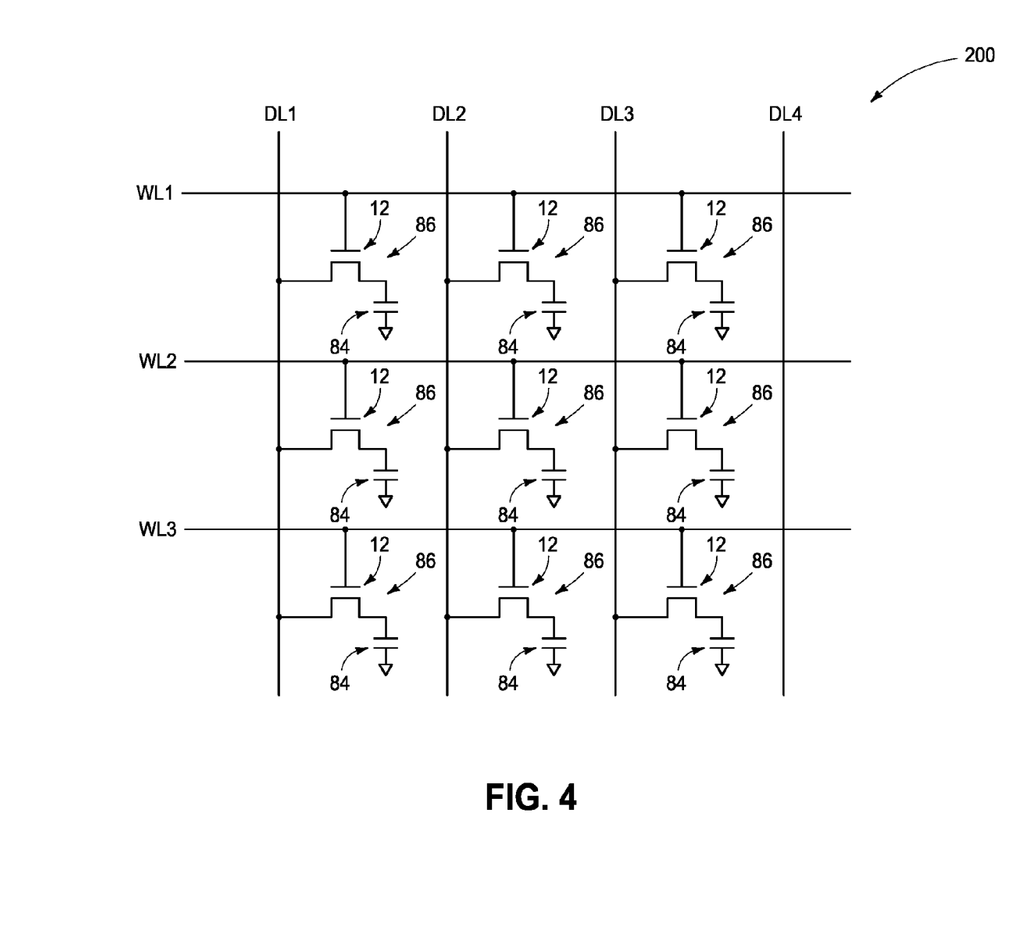
FIG. 4 is a schematic diagram of a region of the memory array of FIG. 3.

FIG. 4 schematically illustrates a region of the memory array 200. The memory array 200 includes a plurality of memory cells 86, with each memory cell including a capacitor 84 and a floating body transistor 12. The wordlines 20 are shown corresponding to wordlines WL1, WL2 and WL3; and the digit lines 82 are shown corresponding to digit lines DL1, DL2, DL3 and DL4. In the illustrated embodiment of FIG. 4 each of the capacitors 84 has one electrode coupled to a source/drain region of a floating body transistor 12, and the other electrode coupled to ground (represented with triangles). The "ground" may be any suitable reference voltage including, but not limited to, 0 V.

In operation each of the memory cells 86 may be uniquely addressed through the combination of a wordline WL1/WL2/WL3 and a digit line DL1/DL2/DL3/DL4.

The memory array 10 of FIG. 1 and the memory array 200 of FIG. 3 may be fabricated with any suitable processing. Example processing is described with reference to FIGS. 5-9.

Figure 5:
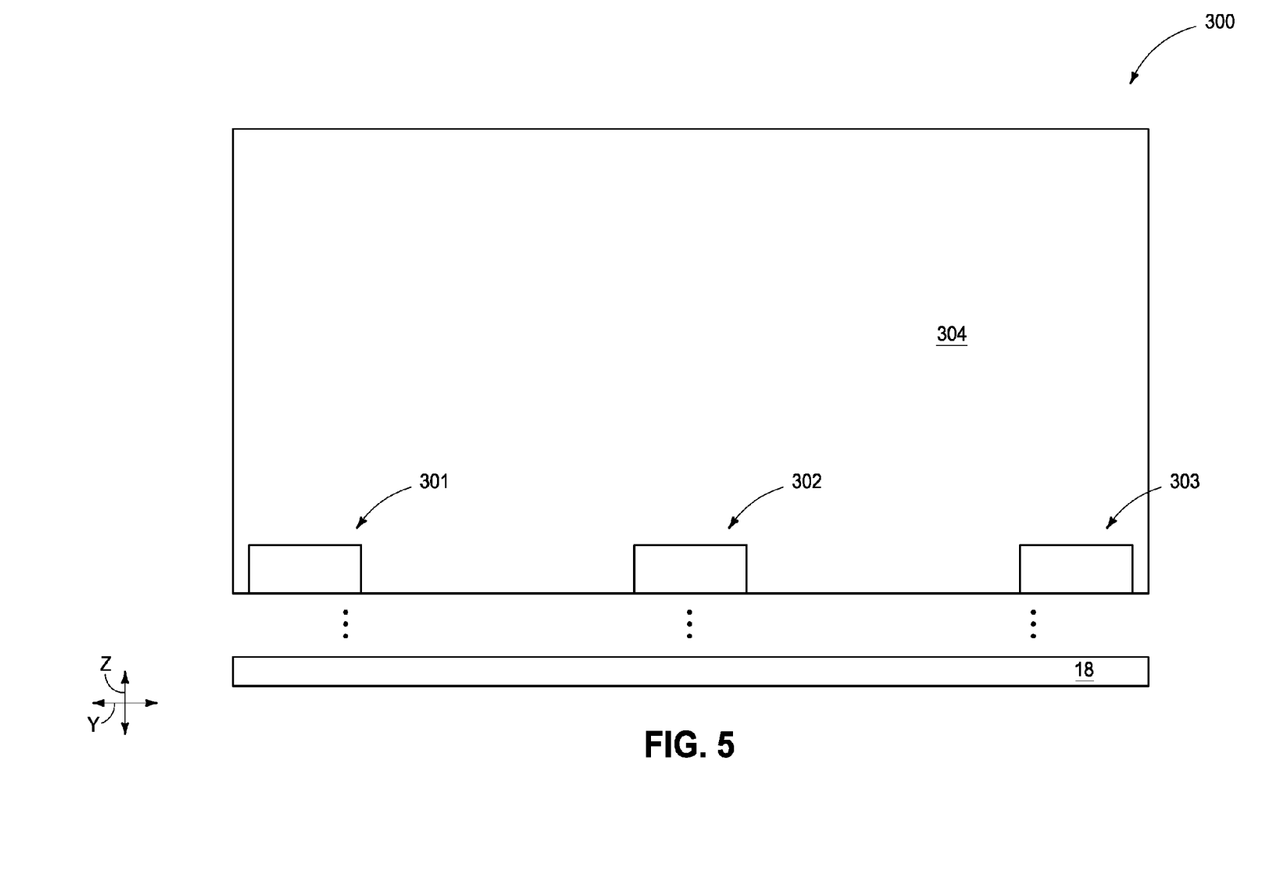
FIGS. 5-8 are diagrammatic cross-sectional views of a region of a construction at various process stages of an example method of forming an example memory array.

Referring to FIG. 5, a construction 300 is illustrated to comprise a plurality of components 301-303. Such components 301-303 may be wordlines 20 of the type shown in FIG. 3, or may comprise capacitor electrode materials and capacitor dielectric materials suitable for utilization in capacitors 14 of the type described above with reference to FIG. 1.

Insulative material 304 is provided over and around the components 301-303. The insulative material 304 may comprise any suitable composition or combination of compositions; including, for example, one or more of silicon dioxide, silicon nitride, borophosphosilicate glass, etc.

Figure 6:
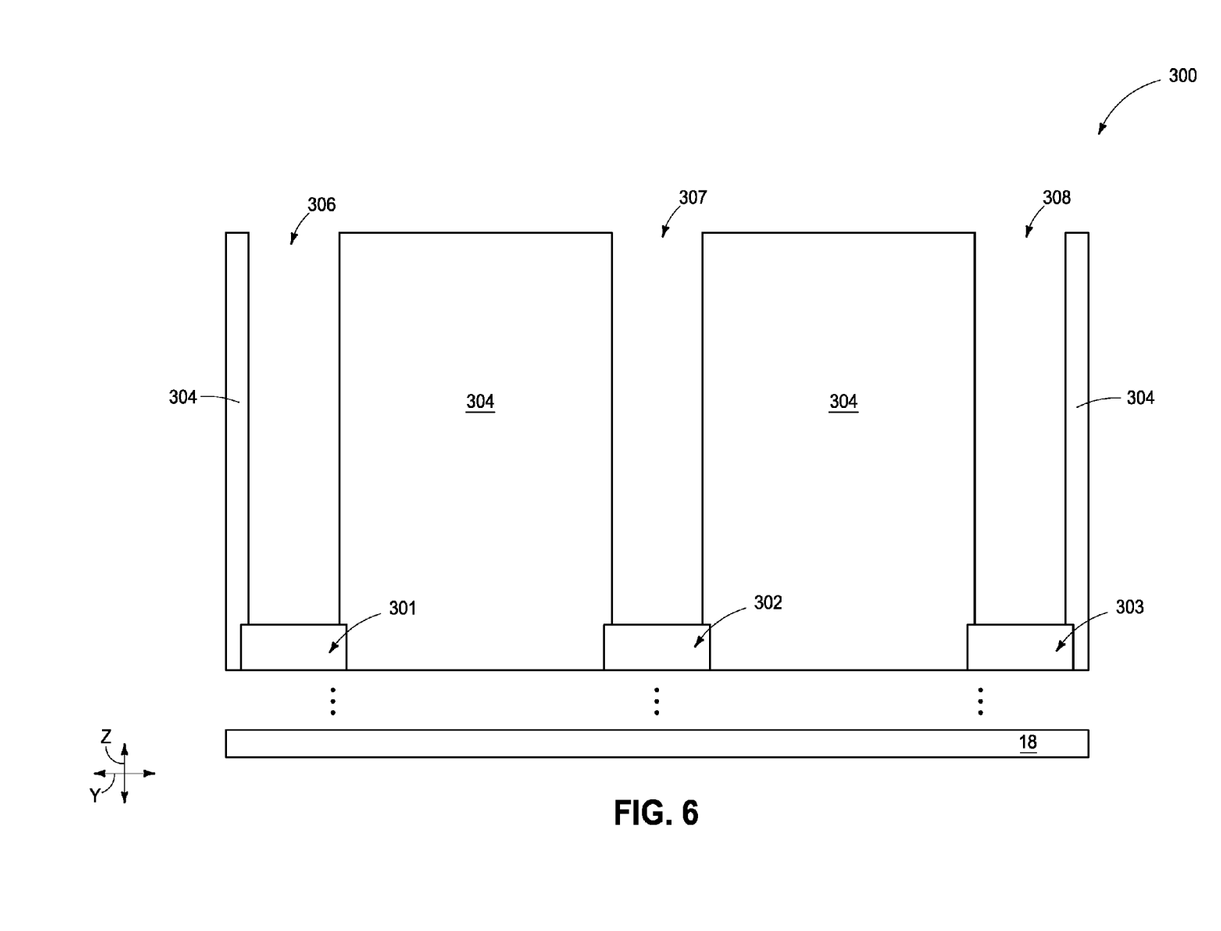

Referring to FIG. 6, trenches 306-308 are etched through the insulative material 304 to upper surfaces of the components 301-303. The view of FIG. 6 is along the Y-direction of FIGS. 1 and 3, and the trenches 306-308 extend along the X-direction of FIGS. 1 and 3. Accordingly, the trenches 306-308 extend in and out of the page relative to the cross-sectional view of FIG. 6.

The trenches 306-308 may be patterned with any suitable processing, including, for example, utilization of a photoresist mask. In some embodiments the components 301-303 may be protected with sacrificial material (for instance, capping material comprising silicon nitride in embodiments in which material 304 comprises silicon dioxide) to protect conductive materials of components 301-303 from being compromised by etch chemistry utilized to form the trenches 306-308. The protective material may be subsequently removed to expose upper conductive surfaces of components 301-303 at the bottoms of trenches 306-308.

Figure 7:
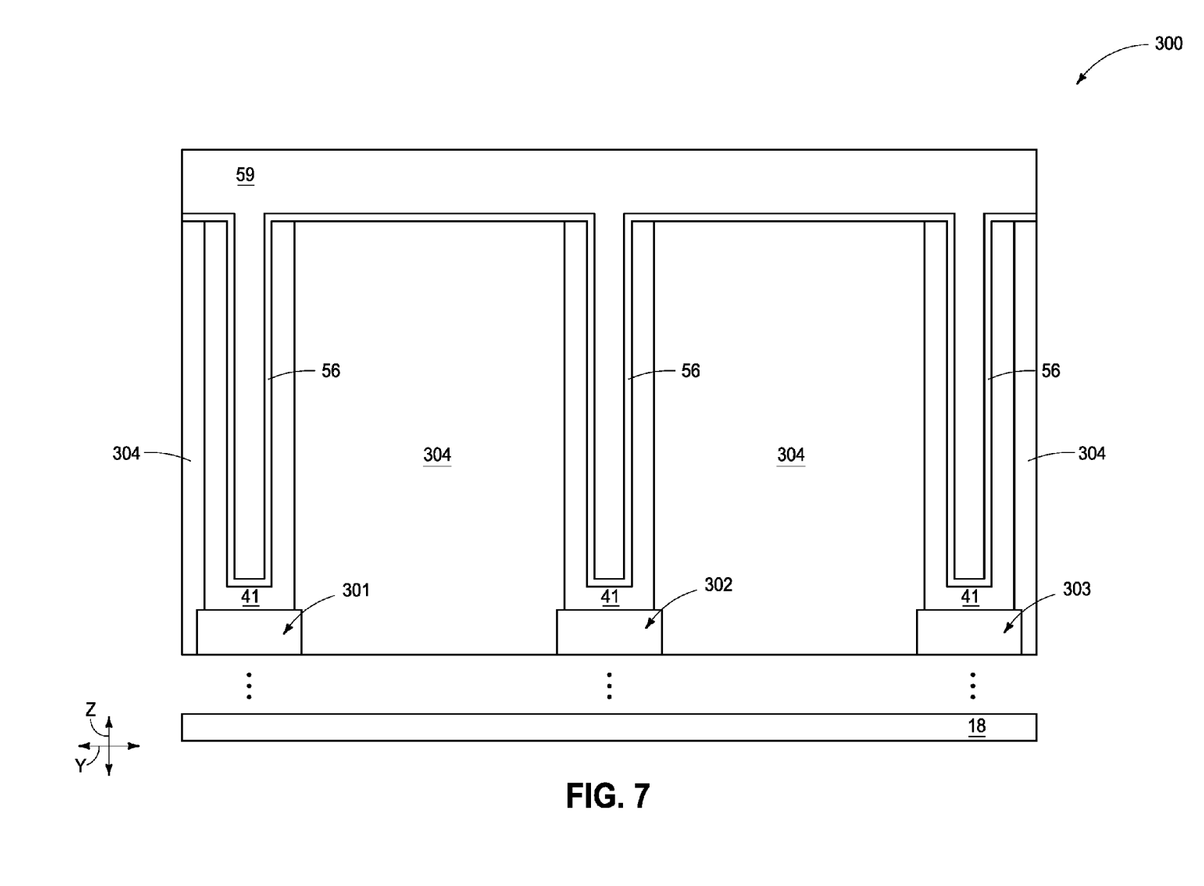

Referring to FIG. 7, the gate structure material 41 is formed within the trenches 306-308 (FIG. 6), and patterned to line sidewalls of the trenches; and then the dielectric material 56 and the semiconductor material 59 are formed within lined trenches 306-308 (FIG. 6). In some embodiments the gate structure material 41 comprises silicon and the dielectric material 56 comprises silicon dioxide grown from a surface of such silicon. In other embodiments the dielectric material 56 may be deposited over the gate structure material 41, particularly if the gate structure material 41 comprises metal.

Figure 8:
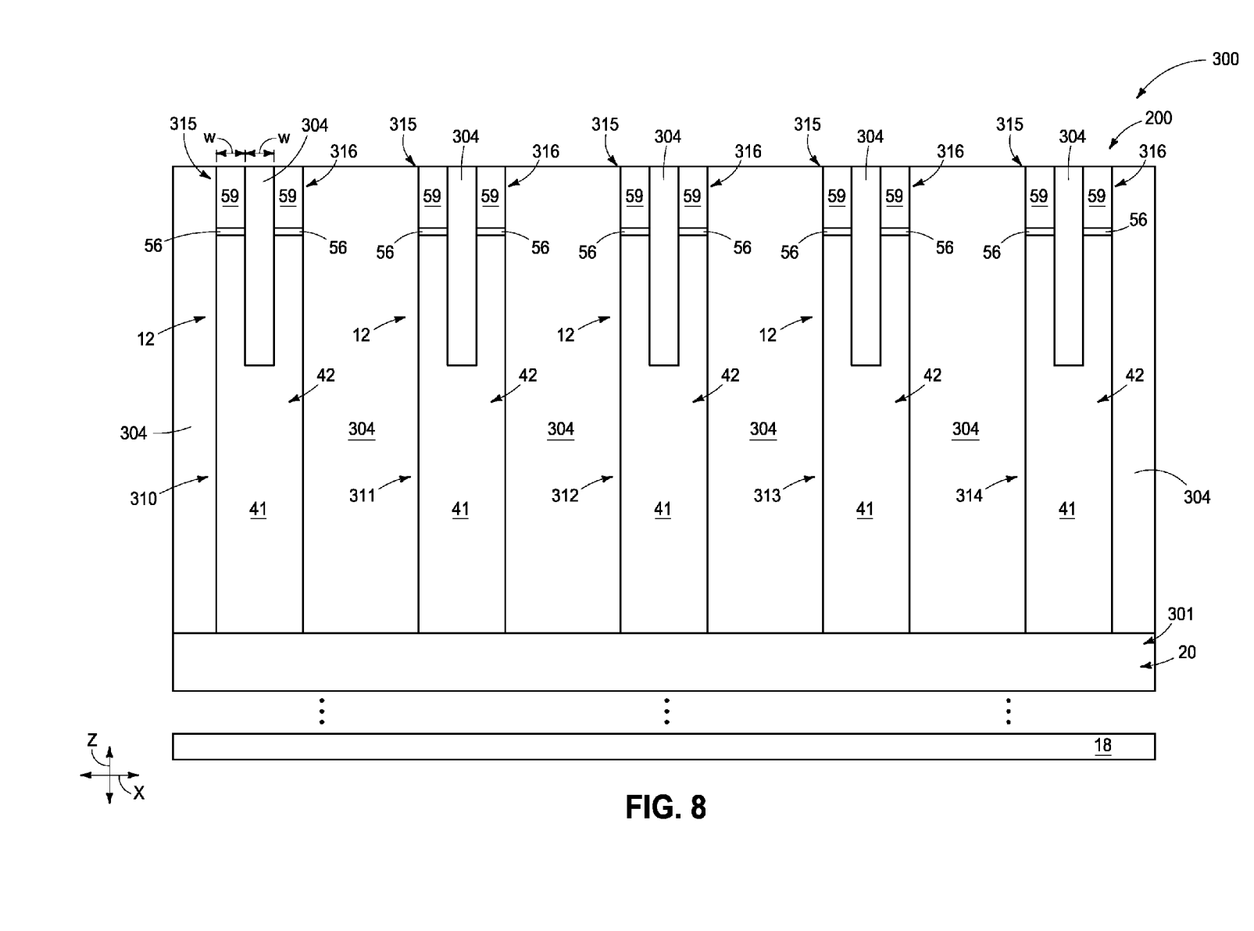

Referring to FIG. 8, construction 300 is rotated and now viewed from along the "X" direction of FIGS. 1 and 3; and is shown after suitable processing to pattern the materials 41, 56 and 59 into the illustrated structures 310-314. The material 41 becomes brackets 42 of the type described above with reference to FIG. 1, and the material 56 becomes the gate dielectric within such brackets. The semiconductor material 59 becomes the semiconductor material bodies 58 (shown and described above with reference to FIG. 1E) of the floating body transistors 12, and also becomes conductive lines 315 and 316 over each of such floating body transistors.

In the embodiment of FIG. 8, the floating body transistors 12 are formed over and directly against a wordline 20, and accordingly the embodiment of FIG. 8 is analogous to that described above with reference to FIG. 3. The conductive line 315 may be utilized as a digit line 82 of the type described above with reference to FIG. 3. In some embodiments, metal-containing material may be formed over conductive lines 314 to become part of the digit lines; and/or at least some of the semiconductor material 59 within conductive lines 315 may be replaced with metal-containing material. The conductive lines 316 may be modified to become electrical interconnects 83 (FIG. 3) extending to capacitors 84 (FIG. 3).

The structures 310-314 may be patterned with any suitable processing. Some of the features are illustrated to have widths "W". Such widths may correspond to any suitable dimension. In some embodiments the widths "W" may be F/2, F/4, F/6, etc.; where "F" is a minimum feature size of a lithographic process utilized during fabrication of structures 310-314.

Insulative material 304 is provided between structures 310-314. Such insulative material may comprise any suitable composition or combination of compositions; including, for example, one or more of silicon nitride, silicon dioxide, borophosphosilicate glass, etc.

The semiconductor material 59 may be conductively doped to form the heavily-doped source/drain regions 68 and 70 (FIG. 1E) at any suitable time. In some embodiments such doping may occur prior to patterning material 59 into the structures 310-314, and in other embodiments at least some of such doping may occur after patterning the material 59 into the structures 310-314.

FIG. 8 shows an embodiment having structures 310-314 incorporated into a memory array of the type described above with reference to FIG. 3 (i.e., memory array 200). Similar processing to that of FIGS. 5-8 may be utilized to form the structures 310-314 incorporated into a memory array of the type described above with reference to FIG. 1 (i.e., memory array 10). Specifically, the components 301-303 (FIGS. 5-7) may comprise materials of capacitors 14.

Figure 9:
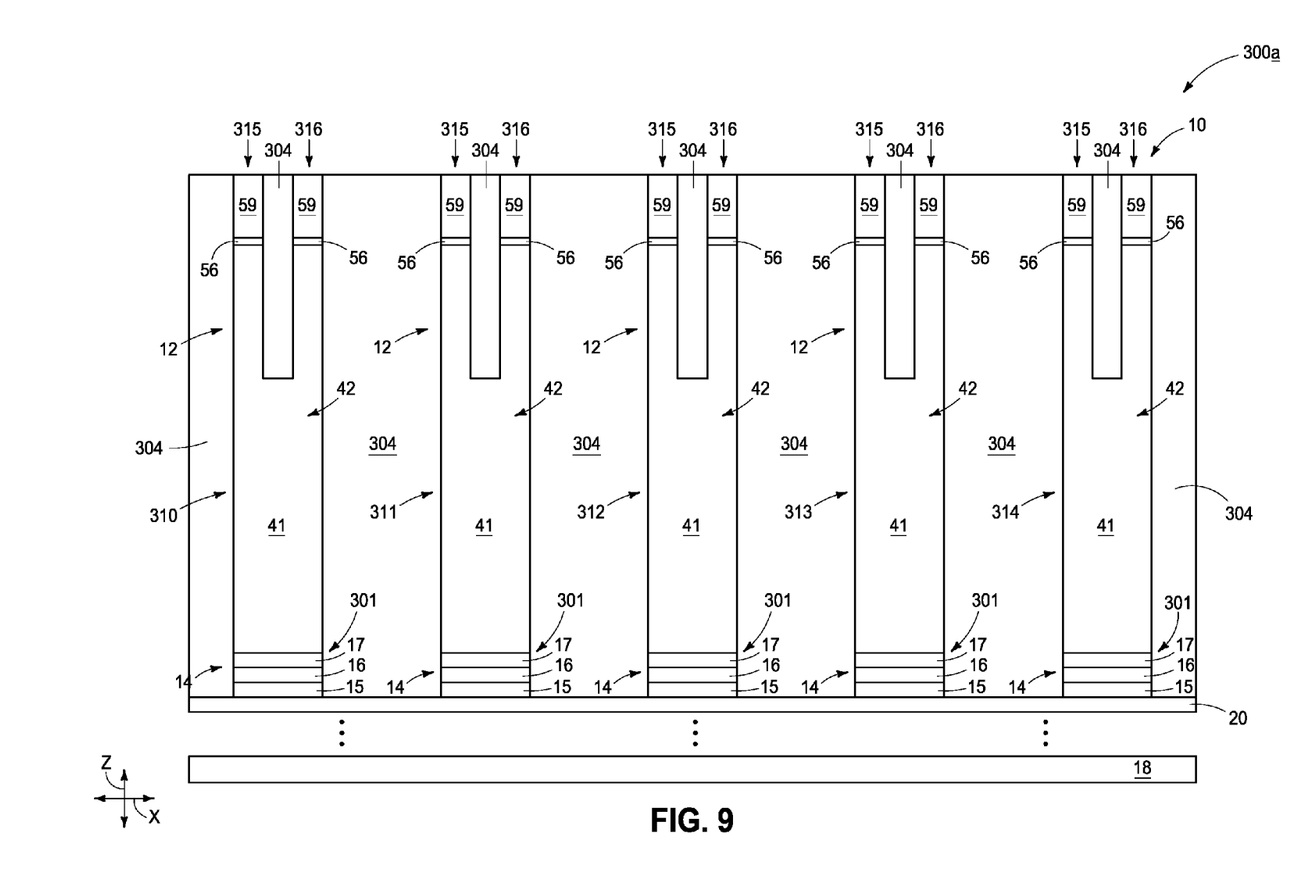
FIG. 9 is a diagrammatic cross-sectional view of a region of an example memory array alternative to that of FIG. 8.

FIG. 9 shows a construction similar to that of FIG. 8, but in which the structures 310-314 are incorporated into a memory array of the type described above with reference to FIG. 1 (i.e., memory array 10). The conductive lines 315 of FIG. 9 may correspond to the conductive lines 30 of FIG. 1, and the conductive lines 316 of FIG. 9 may correspond to the conductive lines 32 of FIG. 1. In some embodiments metal-containing materials may be provided over lines 315/316 during formation of lines 30/32 (FIG. 1); and in some embodiments at least some of the semiconductor material of lines 315/316 may be replaced with metal-containing material during formation of lines 30/32 (FIG. 1).

The structures and memory arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, unless specifically stated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a floating body transistor which includes a gate structure configured as a bracket having two upwardly-projecting sidewalls joined to a base. A region between the upwardly-projecting sidewalls and over the base is an interior region of the bracket. The interior region of the bracket has an interior surface along an upper surface of the base, and along inward surfaces of the upwardly-projecting sidewalls. The sidewalls are a first sidewall and a second sidewall. The first sidewall has a first notch extending downwardly therein, and the second sidewall has a second notch extending downwardly therein. The first and second notches are horizontally aligned with one another. Dielectric material lines the interior surface of the bracket. A semiconductor material body is within the interior region of the bracket and is spaced from the bracket by the dielectric material. The semiconductor material body has a third notch extending therein. The third notch is horizontally aligned with the first and second notches.

Some embodiments include a memory array which comprises a wordline and a plurality of floating body transistors along the wordline. Each of the floating body transistors includes a gate structure configured as a bracket having two upwardly-projecting sidewalls joined to a base, with a region between the upwardly-projecting sidewalls and over the base being an interior region of the bracket. The interior region of the bracket has an interior surface along an upper surface of the base, and along inward surfaces of the upwardly-projecting sidewalls. The sidewalls are a first sidewall and a second sidewall. The first sidewall has a first notch extending downwardly therein, and the second sidewall has a second notch extending downwardly therein. The first and second notches are horizontally aligned with one another. Dielectric material lines the interior surface of the bracket. A semiconductor material body is within the interior region of the bracket and is spaced from the bracket by the dielectric material. The semiconductor material body has a third notch extending therein, and the third notch is horizontally aligned with the first and second notches. The semiconductor material body has a lower trunk region electrically coupled with the wordline, and bifurcates into two branches projecting upwardly from the lower trunk region and extending along the third notch. The branches are a first branch on one side of the third notch and a second branch on the other side of the third notch. The first branch comprises a first source/drain region and the second branch comprises a second source/drain region. The memory array includes digit lines electrically coupled with the first source/drain regions, and includes charge-storage devices electrically coupled with the second source/drain regions.

Some embodiments include a memory array which comprises a plurality of spaced-apart capacitors, and a plurality of floating body transistors over the capacitors and in one-to-one correspondence with the capacitors. Each of the floating body transistors includes a gate structure configured as a bracket having two upwardly-projecting sidewalls joined to a base, with a region between the upwardly-projecting sidewalls and over the base being an interior region of the bracket. The interior region of the bracket has an interior surface along an upper surface of the base, and along inward surfaces of the upwardly-projecting sidewalls. The sidewalls are a first sidewall and a second sidewall. The first sidewall has a first notch extending downwardly therein, and the second sidewall has a second notch extending downwardly therein. The first and second notches are horizontally aligned with one another. Dielectric material lines the interior surface of the bracket. A semiconductor material body is within the interior region of the bracket and is spaced from the bracket by the dielectric material. The semiconductor material body has a third notch extending therein, and the third notch is horizontally aligned with the first and second notches. The semiconductor material body has a lower trunk region electrically coupled with one of the capacitors, and bifurcates into two branches projecting upwardly from the lower trunk region and extending along the third notch. The branches are a first branch on one side of the third notch and a second branch on the other side of the third notch. The first branch comprises a first source/drain region and the second branch comprises a second source/drain region. The memory array includes first conductive lines electrically coupled with the first source/drain regions, and second conductive lines electrically coupled with the second source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A floating body transistor, comprising:
   a gate structure configured as a bracket having two upwardly-projecting sidewalls joined to a base; a region between the upwardly-projecting sidewalls and over the base being an interior region of the bracket; the sidewalls being a first sidewall and a second sidewall; the first sidewall having a first notch extending downwardly therein, and the second sidewall having a second notch extending downwardly therein; the first and second notches being horizontally aligned with one another;
   a semiconductor material body within the interior region of the bracket and spaced from the bracket; and
   the semiconductor material body having a third notch extending therein, with said third notch being horizontally aligned with the first and second notches.

2. The floating body transistor of claim 1 wherein the semiconductor material body has a lower trunk region and bifurcates into two branches projecting upwardly from the lower trunk region and extending along the third notch; the branches being a first branch on one side of the third notch and a second branch on the other side of the third notch; the branches comprising heavily-doped source/drain regions, and a channel region extending between the heavily-doped source/drain regions and under the third notch.

3. The floating body transistor of claim 1 wherein the semiconductor material body comprises silicon.

4. The floating body transistor of claim 1 wherein the gate structure comprises conductively-doped silicon.

5. The floating body transistor of claim 1 wherein the gate structure comprises metal.

6. A memory array, comprising:
   a wordline;
   a plurality of floating body transistors along the wordline; each of the floating body transistors comprising:
      a gate structure configured as a bracket having two upwardly-projecting sidewalls joined to a base; a region between the upwardly-projecting sidewalls and over the base being an interior region of the bracket; the sidewalls being a first sidewall and a second sidewall; the first sidewall having a first notch extending downwardly therein, and the second sidewall having a second notch extending downwardly therein; the first and second notches being horizontally aligned with one another;
      a semiconductor material body within the interior region of the bracket and spaced from the bracket by an insulative region; and
      the semiconductor material body having a third notch extending therein, with said third notch being horizontally aligned with the first and second notches; wherein the semiconductor material body has a lower trunk region electrically coupled with the wordline, and bifurcates into two branches projecting upwardly from the lower trunk region and extending along the third notch; the branches being a first branch on one side of the third notch and a second branch on the other side of the third notch; the first branch comprising a first source/drain region and the second branch comprising a second source/drain region; and
   digit lines electrically coupled with the first source/drain regions.

7. The memory array of claim 6 wherein each of the semiconductor material bodies has a channel region between the first and second source/drain regions and extending to under the third notch.

8. The memory array of claim 6 wherein the semiconductor material bodies comprise silicon.

9. The memory array of claim 6 wherein the gate structures comprise conductively-doped silicon.

10. The memory array of claim 6 wherein the gate structures comprise metal.

11. A memory array, comprising:
    a plurality of spaced-apart capacitors;
    a plurality of floating body transistors over the capacitors and in one-to-one correspondence with the capacitors; each of the floating body transistors comprising:

a gate structure configured as a bracket having two upwardly-projecting sidewalls joined to a base; a region between the upwardly-projecting sidewalls and over the base being an interior region of the bracket; the sidewalls being a first sidewall and a second sidewall; the first sidewall having a first notch extending downwardly therein, and the second sidewall having a second notch extending downwardly therein; the first and second notches being horizontally aligned with one another;

a semiconductor material body within the interior region of the bracket and spaced from the bracket; and the semiconductor material body having a third notch extending therein, with said third notch being horizontally aligned with the first and second notches; wherein the semiconductor material body has a lower trunk region electrically coupled with one of the capacitors, and bifurcates into two branches projecting upwardly from the lower trunk region and extending along the third notch; the branches being a first branch on one side of the third notch and a second branch on the other side of the third notch; the first branch comprising a first source/drain region and the second branch comprising a second source/drain region;

first conductive lines electrically coupled with the first source/drain regions; and second conductive lines electrically coupled with the second source/drain regions.

12. The memory array of claim 11 wherein the capacitors are ferroelectric capacitors.

13. The memory array of claim 11 wherein the semiconductor material bodies comprise silicon.

14. The memory array of claim 11 wherein the gate structures comprise conductively-doped silicon.

15. The memory array of claim 11 wherein the gate structures comprise metal.

16. The memory array of claim 11 wherein upper surfaces of the capacitors comprises metal, and wherein the gate structures comprise conductively-doped silicon which is directly against the metal of the upper surfaces of the capacitors.

17. The memory array of claim 11 wherein the first conductive lines are at power supply voltage, Vcc; and the second conductive lines are at a ground voltage, Vss.

* * * * *